(12) United States Patent
Nakamura et al.

(10) Patent No.: US 8,585,821 B2
(45) Date of Patent: Nov. 19, 2013

(54) SIC EPITAXIAL SUBSTRATE AND METHOD FOR PRODUCING THE SAME (75) Inventors: Nobuhiko Nakamura, Kyoto (JP); Toru Matsunami, Kyoto (JP); Kimito Nishikawa, Kyoto (JP)

(73) Assignees: Ecotron Co., Ltd., Kyoto (JP); Research Institute of Innovative Technology for the Earth, Kyoto (JP)

( * ) Notice: Subject to any disclaimer, the term of this patent is extended or adjusted under 35 U.S.C. 154(b) by 919 days.

(21) Appl. No.: 12/452,084

(22) PCT Filed: Mar. 11, 2008

(86) PCT No.: PCT/JP2008/054333
§ 371 (c)(1),
(2), (4) Date: Dec. 15, 2009

(87) PCT Pub. No.: WO2009/013914
PCT Pub. Date: Jan. 29, 2009

(65) Prior Publication Data
US 2010/0119849 A1 May 13, 2010

(30) Foreign Application Priority Data

Jul. 26, 2007 (JP) .................. 2007-195061

(51) Int. Cl.
C30B 25/02 (2006.01)
C30B 25/18 (2006.01)
C30B 29/36 (2006.01)
C30B 13/00 (2006.01)
C30B 29/06 (2006.01)

(52) U.S. Cl.
CPC .......... C30B 25/02 (2013.01); *C30B 25/18* (2013.01); *C30B 29/36* (2013.01); *C30B 13/00* (2013.01); *C30B 29/06* (2013.01)
USPC ............. 117/101; 117/951; 117/109; 117/43; 428/446

(58) Field of Classification Search
CPC ....................................... C30B 25/02
USPC ................. 117/101, 951, 109, 43; 428/446
See application file for complete search history.

(56) References Cited

U.S. PATENT DOCUMENTS 4,687,655 A * 8/1987 Hunold et al. ............... 423/344
(Continued)

FOREIGN PATENT DOCUMENTS

EP 1 215 730 6/2002
(Continued)

OTHER PUBLICATIONS

"Liquid phase epitaxial growth of SiC", M. Syvajarvi, R. Yakimova, H.H. Radamson, N.T. Son, Q. Wahab, I.G. Ivanov, Journal of Crystal Growth 197 (1999) 147-154.*

(Continued)

Primary Examiner — Michael Kornakov
Assistant Examiner — Hua Qi
(74) Attorney, Agent, or Firm — Harness, Dickey & Pierce, P.L.C.

(57) ABSTRACT

In one embodiment of the present invention, a monocrystal SiC epitaxial substrate is produced which includes a monocrystal SiC substrate; a buffer layer made of a first SiC epitaxial film formed on the monocrystal SiC substrate; and an active layer made of a second SiC epitaxial film formed on the buffer layer. The buffer layer is grown by heat-treating a set of the monocrystal SiC substrate, a carbon source plate, and a metal Si melt layer having a predetermined thickness and interposed between the monocrystal SiC substrate and the metal Si melt layer, so as to epitaxially grow monocrystal SiC on the monocrystal SiC substrate. The active layer is grown by epitaxially growing monocrystal SiC on the buffer layer by vapor phase growth method. This allows for production of a monocrystal SiC epitaxial substrate including a high-quality monocrystal SiC active layer being low in defects.

5 Claims, 2 Drawing Sheets

(56) References Cited

U.S. PATENT DOCUMENTS

| | | | |
|---|---|---|---|
| 5,575,862 A * | 11/1996 | Nishida | 136/258 |
| 5,679,153 A | 10/1997 | Dmitriev et al. | |
| 6,734,461 B1 * | 5/2004 | Shiomi et al. | 257/77 |
| 7,527,869 B2 | 5/2009 | Kaneko et al. | |
| 2004/0237879 A1 | 12/2004 | Kaneko et al. | |
| 2007/0001175 A1 | 1/2007 | Kojima et al. | |
| 2009/0038538 A1 | 2/2009 | Kaneko et al. | |

FOREIGN PATENT DOCUMENTS

| | | |
|---|---|---|
| EP | 1 403 404 | 3/2004 |
| EP | 1 657 740 | 5/2006 |
| JP | 2000-319099 | 11/2000 |
| JP | 2005-126246 | 5/2005 |
| JP | 2005-126248 | 5/2005 |
| JP | 2005126248 A * | 5/2005 |
| JP | 2007-284298 | 11/2007 |
| WO | WO 00/68474 | 11/2000 |

OTHER PUBLICATIONS

European Search Report dated Mar. 29. 2011 issued in corresponding European Application No. 08721749.3.

* cited by examiner

SIC EPITAXIAL SUBSTRATE AND METHOD FOR PRODUCING THE SAME

TECHNICAL FIELD

The present invention relates to a SiC epitaxial substrate including a SiC epitaxial film formed on a monocrystal SiC substrate, and also to a method for producing the SiC epitaxial substrate.

BACKGROUND ART

SiC (silicon carbide) is characterized as (i) excelling in heat resistance and mechanical strength, (ii) being resistant to radiation, (iii) being easily controllable for valence of electrons or holes by doping, and (iv) having a large forbidden band width. For reasons such as these, SiC is expected as a semiconductor material for next-generation power devices and high-frequency devices.

Unfortunately, a monocrystal SiC substrate is inherently likely to have crystal defects caused by heat, such as a basal plane dislocation, a screw dislocation, and a micropipe. Further, a monocrystal SiC substrate likely has grain boundaries arising from nucleation.

Thus, when an active layer made of monocrystal SiC is grown on a monocrystal SiC substrate by vapor phase growth method, which is currently the mainstream of SiC epitaxial growth processes, crystal defects and/or the like inherent in the monocrystal SiC substrate are problematically propagated to the active layer.

In view of this, Patent Literature 1, for example, discloses the following technique: A first epitaxial layer is formed on a monocrystal SiC by liquid phase growth method (LPE). Then, a second epitaxial layer is formed on the first epitaxial layer by CVD. This prevents propagation of micropipe defects from the SiC substrate.

Further, Patent Literatures 2 to 4 disclose a liquid phase growth method (hereinafter referred to as metastable solvent epitaxy, or MSE) by which a set of a monocrystal SiC substrate, a polycrystalline SiC substrate, and an extremely thin metal silicon melt interposed between them is heat-treated so that monocrystal SiC is epitaxially grown. The method disclosed in Patent Literatures 2 to 4 for growing monocrystal SiC has an advantage in that it not only allows for formation of highly flat monocrystal SiC in which occurrence of micropipe defects is prevented, but also achieves a high growth rate.

CITATION LIST

Patent Literature 1

Japanese Translation of PCT International Publication, Tokuhyou, No. 10-509943 (Publication Date: Jun. 6, 1996)

Patent Literature 2

International Publication WO2002/099169 (Publication Date: Dec. 12, 2002)

Patent Literature 3

Japanese Patent Application Publication, Tokukai, No. 2005-126248 A (Publication Date: May 19, 2005)

Patent Literature 4

Japanese Patent Application Publication, Tokukai, No. 2005-126249 A (Publication Date: May 19, 2005)

SUMMARY OF INVENTION

While the techniques of Patent Literatures 2 to 4 do prevent occurrence of micropipe defects, they fail to sufficiently prevent occurrence of such defects as basal plane dislocations and screw dislocations. Thus, such defects problematically occur in the active layer in these conventional arts.

Further, the technique of Patent Literature 1 does prevent occurrence of micropipe defects in the first epitaxial layer. However, for example, crystal defects other than micropipes, the crystal defects being inherent in the monocrystal SiC substrate, are likely to be propagated via the first epitaxial layer to the second epitaxial layer. Thus, the technique problematically fails to prevent occurrence of crystal defects in the second epitaxial layer.

The technique of Patent Literature 1 additionally has the following problems: Since the first epitaxial layer is grown by LPE, its growth rate is very low, thus leading to low productivity. Also, while controlling film thickness to achieve its uniformity requires precise control of a liquid phase in production equipment, such precise control of the liquid phase has its limits. This makes it difficult to precisely control the film thickness. In addition, the technique requires a complicated process, and requires a very high production cost.

The present invention has been accomplished in view of the above problems. It is an object of the present invention to provide a monocrystal SiC epitaxial substrate including a high-quality monocrystal SiC active layer being low in defects, and also to provide a method for producing such a monocrystal SiC epitaxial substrate.

The inventors of the present invention have diligently studied SiC epitaxial films grown by MSE mentioned above and consequently found that SiC epitaxial films grown by MSE have a property (defect propagation reducing function) of not easily propagating such crystal defects as basal plane dislocations and screw dislocations. The present invention utilizes this property unique to monocrystal SiC grown by MSE.

A monocrystal SiC epitaxial substrate of the present invention includes: a monocrystal SiC substrate; a buffer layer made of a first SiC epitaxial film formed on the monocrystal SiC substrate; and an active layer made of a second SiC epitaxial film formed on the buffer layer, the first SiC epitaxial film being epitaxially grown by heat-treating a set of the monocrystal SiC substrate, a carbon source plate, and a metal Si melt layer, the carbon source plate being so disposed away from the monocrystal SiC substrate by a predetermined distance as to face the monocrystal SiC substrate, the metal Si melt layer being interposed between the monocrystal SiC substrate and the carbon source plate, the second SiC epitaxial film being epitaxially grown by vapor phase growth method.

Note that the above predetermined thickness, i.e., the thickness of the metal Si melt layer along the direction perpendicular to the monocrystal SiC substrate, can be any thickness, provided that carbon dissolved from the carbon source plate is capable of being transported to a surface of the monocrystal SiC substrate by diffusion or the like. Thus, the thickness is not particularly limited.

The carbon source plate is not particularly limited to a specific kind, provided that it is capable of supplying carbon via the metal Si melt onto the monocrystal SiC substrate. The carbon source plate may, for example, be a polycrystalline SiC substrate, a carbon substrate, a porous SiC substrate, a sintered SiC substrate, or an amorphous SiC substrate.

According to the above arrangement, the buffer layer is made of the first SiC epitaxial film epitaxially grown by heat-treating the set of the monocrystal SiC substrate, the carbon source plate, and the metal Si melt layer having a predetermined thickness and interposed between the monocrystal SiC substrate and the carbon source plate. The SiC epitaxial film grown by the above method has the property of not easily propagating crystal defects such as basal plane dislocations and screw dislocations, in comparison with SiC epitaxial films grown by conventional vapor phase or liquid phase growth method. Because of this, crystal defects inherent in the monocrystal SiC substrate, such as basal plane dislocations and screw dislocations are prevented from being propagated to the active layer, which is made of the second SiC epitaxial film and is formed on the buffer layer made of the first monocrystal SiC epitaxial film. This provides an active layer being very low in crystal defects.

Further, according to this arrangement, even use of an inexpensive monocrystal SiC substrate having relatively many defects allows for formation of an active layer being low in defects. This makes it possible to provide an inexpensive monocrystal SiC epitaxial substrate including an active layer being low in defects.

Still further, according to this arrangement, controlling the distance between the monocrystal SiC substrate and the carbon source plate allows for easy and accurate control of the thickness of the metal Si melt layer. This in turn makes it possible to provide a monocrystal SiC epitaxial substrate including a buffer layer having a thickness controlled uniformly and accurately.

This arrangement includes an active layer made of the second SiC epitaxial film grown by vapor phase growth method. In general, vapor phase growth method allows for easy and accurate control of film thickness, in comparison with other methods such as liquid phase growth method. As a result, this arrangement makes it possible to provide a monocrystal SiC epitaxial substrate including an active layer having a film thickness controlled accurately and uniformly.

The first SiC epitaxial film may be identical with the monocrystal SiC substrate in terms of conduction type. For example, both the monocrystal SiC substrate and the first SiC epitaxial film may be of the p type. Conversely, both the monocrystal SiC substrate and the first SiC epitaxial film may be of the n type.

The monocrystal SiC substrate may have an off angle. This allows step-flow growth of the first SiC epitaxial film. This in turn allows the film thickness of a grown film to be controlled accurately so as to achieve its uniformity. This makes it possible to provide a monocrystal SiC epitaxial substrate including a buffer layer having a film thickness controlled uniformly and accurately.

The second SiC epitaxial film may be grown by step-controlled epitaxy.

According to the above arrangement, growing the active layer by step-controlled epitaxy makes it possible to provide a monocrystal SiC epitaxial substrate including an active layer having a film thickness controlled uniformly and accurately.

In order to solve the above problems, a method for producing a monocrystal SiC epitaxial substrate according to the present invention is a method for producing a monocrystal SiC epitaxial substrate, the monocrystal SiC epitaxial substrate including: a monocrystal SiC substrate; a buffer layer made of a first SiC epitaxial film formed on the monocrystal SiC substrate; and an active layer made of a second SiC epitaxial film formed on the buffer layer, the method including: a first film forming step for forming the first SiC epitaxial film by heat-treating a set of (i) the monocrystal SiC substrate, (ii) a carbon source plate, and (iii) a metal Si melt layer having a predetermined thickness and interposed between the monocrystal SiC substrate and the carbon source plate, so as to epitaxially grow monocrystal SiC; and a second film forming step for forming the second SiC epitaxial film by epitaxially growing monocrystal SiC on the first epitaxial film by vapor phase growth method.

The above method causes monocrystal SiC to be epitaxially grown by heat-treating the set of the monocrystal SiC substrate, the carbon source plate, and the metal Si melt layer having a predetermined thickness and interposed between the monocrystal SiC substrate and the carbon source plate, whereby a buffer layer made of a SiC epitaxial film is formed. The SiC epitaxial film grown by the above method has a property of not easily propagating crystal defects such as basal plane dislocations and screw dislocations, in comparison with SiC epitaxial films grown by conventional vapor phase or liquid phase growth method. This prevents crystal defects inherent in the monocrystal SiC substrate, such as basal plane dislocations and screw dislocations, from being propagated to the active layer, which is made of the second SiC epitaxial film and is formed on the buffer layer. This provides an active layer being very low in crystal defects.

Further, according to the above method, even use of an inexpensive monocrystal SiC substrate having relatively many defects allows formation of an active layer having a low defect rate. This makes it possible to provide an inexpensive monocrystal SiC epitaxial substrate including an active layer being low in defects.

Still further, this method, controls the distance between the monocrystal SiC substrate and the carbon source plate. This arrangement allows easy and accurate control of the thickness of the metal Si melt layer. This consequently makes it possible to provide a monocrystal SiC epitaxial substrate including a buffer layer having a thickness controlled uniformly and accurately.

This method uses an active layer made of the second SiC epitaxial film grown by vapor phase growth method. In general, vapor phase growth method allows easy and accurate control of film thickness, in comparison with other methods such as liquid phase growth method. As a result, the above method makes it possible to provide a monocrystal SiC epitaxial substrate including an active layer having a film thickness controlled accurately and uniformly.

The first film forming step may include: a temperature-increasing step for increasing a temperature of the metal Si melt layer to a predetermined temperature set to a temperature not lower than a melting point of Si; and a temperature-decreasing step for decreasing the temperature of the metal Si melt layer from the predetermined temperature to a temperature not higher than 500° C.; the temperature of the metal Si melt layer is changed at least from the melting point of Si to the growth temperature at a rate of 20° C. per minute during the temperature-increasing step; and the temperature of the metal Si melt layer is changed at the rate of 20° C. per minute during the temperature-decreasing step.

This method reduces thermal stress that is applied on the first monocrystal SiC epitaxial film during the temperature-increasing step and the temperature-decreasing step. This prevents such defects as cracks caused due to the thermal stress and further prevents crystal defects caused due to distortion in the crystal structure caused by a sudden rise in the temperature.

In the first film forming step, the monocrystal SiC substrate has a planarized surface, and the first SiC epitaxial film is grown on the planarized surface of the monocrystal SiC substrate.

This arrangement uses a monocrystal SiC substrate having been subjected to a planarizing process. This improves the buffer layer and the active layer in uniformity of their film thicknesses and in flatness. This arrangement further reduces the number of crystal defects propagated from the monocrystal SiC substrate to the active layer and the number of new crystal defects occurring when the buffer layer is grown.

The monocrystal SiC substrate may have an off angle; and the method includes providing spacers at ends of a region between the monocrystal SiC substrate and the carbon source plate, the ends being located along a direction of inclination of the off angle, as to maintain a distance between the monocrystal SiC substrate and the carbon source plate during the first film forming step.

The use of a monocrystal SiC substrate having an off angle results in that a SiC epitaxial film, from which the buffer layer is to be formed, is grown along the off-angle direction by step-flow growth. If spacers are provided at positions other than the ends along the off angle direction, such spacers will cause crystal defects in a wide region at a central portion of the substrate. This is because, for example, crystal defects tend to propagate along a direction perpendicular to the direction of step-flow growth. In contrast, according to the method mentioned above, the spacers are provided at the ends along the off-angle direction. This limits occurrence of crystal defects caused due to the spacers to upstream and downstream ends along the direction of step-flow growth. As a result, crystal defects due to the spacers will not occur in the buffer layer at its portion corresponding to a central portion of the substrate.

Another method for producing a monocrystal SiC epitaxial substrate according to the present invention is a method for producing a monocrystal SiC epitaxial substrate, the monocrystal SiC epitaxial substrate including: a monocrystal SiC substrate; and a SiC epitaxial film formed on the monocrystal SiC substrate, the method including: a film forming step for forming the SiC epitaxial film by heat-treating a set of (i) the monocrystal SiC substrate, (ii) a carbon source plate, and (iii) a metal Si melt layer having a predetermined thickness and interposed between the monocrystal SiC substrate and the carbon source plate, so as to epitaxially grow monocrystal SiC, wherein: the film forming step includes: a temperature-increasing step for increasing a temperature of the metal Si melt layer to a predetermined temperature (growth temperature) set to a temperature not lower than a melting point of Si; and a temperature-decreasing step for decreasing the temperature of the metal Si melt layer from the predetermined temperature to a temperature not higher than 500° C., the temperature of the metal Si melt layer is changed from the melting point of Si to the growth temperature at a rate of 20° C. per minute during the temperature-increasing step; and the temperature of the metal Si melt layer is changed at the rate of 20° C. per minute during the temperature-decreasing step.

The above method reduces thermal stress that is applied on the SiC epitaxial film during the temperature-increasing step and the temperature-decreasing step. This prevents such defects as cracks caused due to the thermal stress and further prevents crystal defects caused due to distortion in the crystal structure caused by a sudden rise in the temperature.

Still another method for producing a monocrystal SiC epitaxial substrate according to the present invention is a method for producing a monocrystal SiC epitaxial substrate, the monocrystal SiC epitaxial substrate including: a monocrystal SiC substrate; and a SiC epitaxial film formed on the monocrystal SiC substrate, the monocrystal SiC substrate having an off angle, the method including: forming the SiC epitaxial film by heat-treating a set of (i) the monocrystal SiC substrate, (ii) a carbon source plate, and (iii) a metal Si melt layer having a predetermined thickness and interposed between the monocrystal SiC substrate and the carbon source plate, so as to epitaxially grow monocrystal SiC; and providing spacers at ends of a region between the monocrystal SiC substrate and the carbon source plate, the ends being located along a direction of inclination of the off angle, as to maintain a distance between monocrystal SiC substrate and the carbon source plate during the step of forming the SiC epitaxial film.

The use of a monocrystal SiC substrate having an off angle results in that a SiC epitaxial film on the monocrystal SiC substrate is grown along the off-angle direction by step-flow growth. If spacers are provided at positions other than the ends along the off angle direction, such spacers will cause crystal defects in a wide region at a central portion of the substrate. This is because, for example, crystal defects tend to propagate along a direction perpendicular to the direction of step-flow growth. In contrast, according to the method mentioned above, the spacers are provided at the ends along the off-angle direction. This limits occurrence of crystal defects caused due to the spacers to upstream and downstream ends along the direction of step-flow growth. As a result, crystal defects due to the spacers will not occur in the SiC epitaxial film at its portion corresponding to a central portion of the substrate

REFERENCE SIGNS LIST 1 monocrystal SiC epitaxial substrate
11 monocrystal SiC substrate
12 buffer layer (first monocrystal SiC epitaxial film)
13 active layer (second monocrystal SiC epitaxial film)
22 supporting substrate
23 spacer
24 carbon source plate
25 Si substrate
26 weight
27 metal Si melt layer

DESCRIPTION OF EMBODIMENTS

Figure 1:
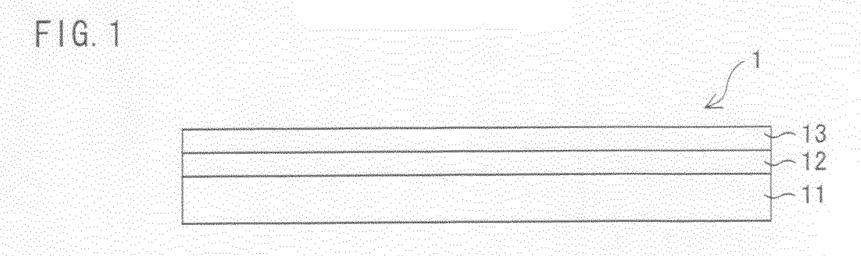
FIG. 1 is a cross-sectional view illustrating a monocrystal SiC epitaxial substrate in accordance with one embodiment of the present invention.

One embodiment of the present invention is described below. FIG. 1 is a cross-sectional view illustrating an arrangement of a monocrystal SiC epitaxial substrate 1 according to the present embodiment.

As illustrated in FIG. 1, the monocrystal SiC epitaxial substrate 1 includes a monocrystal SiC substrate 11; a buffer layer 12 formed on the monocrystal SiC substrate 11; and an active layer 13 formed on the buffer layer 12.

The monocrystal SiC substrate 11 may be conventionally known monocrystal SiC substrate (e.g., a commercially available monocrystal SiC substrate). The present embodiment used a 4H—SiC substrate having an 8-degree off angle along a direction indicated by <11-20>. Further, the monocrystal SiC substrate 11 of the present embodiment had a surface on which the buffer layer 12 was formed, the surface having been planarized by chemical mechanical polishing (CMP) before the buffer layer 12 was formed. The planarization removed trace of polishing (polishing marks), etc.

The buffer layer 12 is made of a monocrystal SiC epitaxial film grown by MSE mentioned above. A method for growing the buffer layer 12 is described below.

The active layer 13 is made of a monocrystal SiC epitaxial film grown on the buffer layer 12 by vapor phase growth method (VPE). The VPE for growing the active layer 13 is not particularly limited. The active layer 13 may be grown by various, conventionally known methods such as CVD, PVD, and MBE. An example method for growing the active layer 13 is described below.

Figure 2:
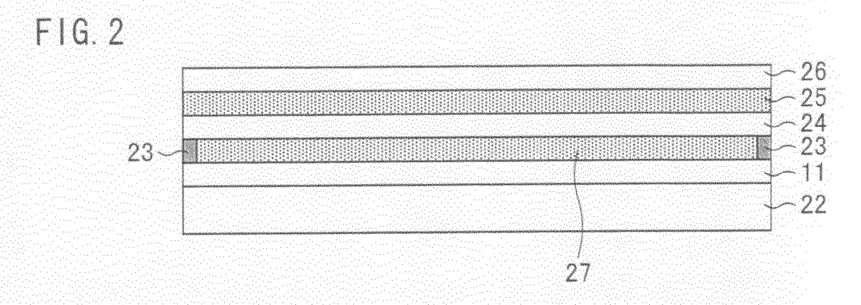
FIG. 2 is an explanatory diagram illustrating a process for forming a buffer layer in a method for producing the monocrystal SiC epitaxial substrate in accordance with the embodiment of the present invention.

The following describes how the monocrystal SiC epitaxial substrate 1 is produced. FIG. 2 is an explanatory diagram illustrating a process for producing the buffer layer 12.

As illustrated in FIG. 2, the following were placed in a closed container (not shown) one on top of another in the order presented below: a supporting substrate 22, the monocrystal SiC substrate 11, spacers 23, a carbon source plate 24, a Si substrate 25, and a weight 26. FIG. 2 illustrates a state in which a heat treatment is being performed so that SiC is epitaxially grown on the monocrystal SiC substrate 11, and that a metal Si melt layer 27 is interposed between the monocrystal SiC substrate 11 and the carbon source plate 24. The heat treatment is described in detail below.

The supporting substrate 22 is a substrate for supporting the monocrystal SiC substrate 11, the spacers 23, the carbon source plate 24, the Si substrate 25, and the weight 26. The supporting substrate 22 also has a function of preventing adverse effects from the closed container, thus contributing to improvement in quality of the monocrystal SiC epitaxial film epitaxially grown on the monocrystal SiC substrate 11. The supporting substrate 22 is not particularly limited as to a material from which it is made. It may be made of, e.g., a material of which the carbon source plate 24 is made. The supporting substrate 22 of the present embodiment was a polycrystalline SiC substrate having a surface that was mirror-polished and that was cleaned to remove adherent matters such as oil, oxide, and metal, by washing or the like.

The monocrystal SiC substrate 11 was, as described above, a 4H—SiC substrate having an 8-degree off angle along the direction indicated by <11-20> and having a surface having been planarized by chemical mechanical polishing (CMP).

The carbon source plate 24 supplies carbon onto the monocrystal SiC substrate 11 via the metal Si melt layer 27 when the heat treatment is performed. The carbon source plate 24 is made of any material that is capable of supplying carbon onto the monocrystal SiC substrate 11. The carbon source plate may, for example, be a polycrystalline Si substrate, a carbon substrate, a porous SiC substrate, a sintered SiC substrate, or an amorphous SiC substrate. As the supporting substrate 22, the carbon source plate of the present embodiment was a polycrystalline SiC substrate having a surface that was mirror-polished and that was cleaned to remove adherent matters such as oil, oxide, and metal, by washing or the like.

The spacers 23 define a distance between the monocrystal SiC substrate 11 and the carbon source plate 24, thereby defining a thickness of the metal Si melt layer 27 (along a direction perpendicular to the substrate surface of each of the monocrystal SiC substrate 11 and the carbon source plate 24). This allows for a uniform thickness of a grown film (i.e., monocrystal SiC epitaxial film) throughout a surface for the growth.

Figure 3:
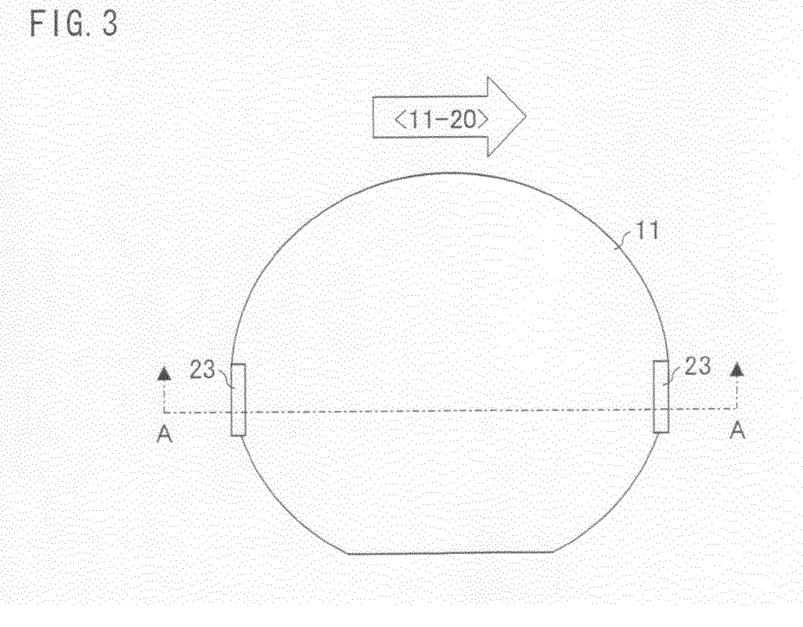
FIG. 3 is a view illustrating the method for producing the monocrystal SiC epitaxial substrate in accordance with the embodiment of the present invention, and is a plan view illustrating an arrangement of the monocrystal SiC substrate and spacers formed on it.

FIG. 3 is a plan view illustrating an arrangement of the monocrystal SiC substrate 11 and the spacers 23 formed on the monocrystal SiC substrate 11.

As illustrated in FIG. 3, the present embodiment included spacers 23 having an identical thickness at respective ends of the monocrystal SiC substrate 11 along the off-angle direction (in the present embodiment, the direction indicated by <11-20>).

The spacers 23 are not particularly limited, provided that they are capable of properly defining the distance between the monocrystal SiC substrate 11 and the carbon source plate 24. Thus, for example, they may be mechanically formed on the monocrystal SiC substrate 11. Alternatively, they may be formed on the monocrystal SiC substrate 11 by, e.g., lithography, deposition, sputtering, ion plating, or vapor phase growth method. Further, instead of being formed on the monocrystal SiC substrate 11, the spacers 23 may be formed on the carbon source plate 24, or may be sandwiched by the monocrystal SiC substrate 11 and the carbon source plate 24 so as to be supported by them. Also, the spacers 23 have any cross section. Thus, they may take various shapes such as a cylinder or a cuboid.

The spacers 23 is not particularly limited in terms of its thickness, provided that the thickness allows carbon transfer from the carbon source plate 24 to the surface of the monocrystal SiC substrate 11. The thickness preferably falls within a range from 1 μm to 50 μm in order to ensure that carbon supplied from the carbon source plate 24 properly travels to the surface of the monocrystal SiC substrate 11. The spacers 23 of the present embodiment had a thickness of 40 μm.

The following describes the heat treatment for forming the buffer layer 12 made of a monocrystal SiC epitaxial film.

To begin with, an internal pressure of a closed container was reduced to $1 \times 10^{-2}$ Pa or lower (i.e., vacuuming was performed). Then, while the pressure was maintained, an internal temperature of the container was raised with a heater (thermoregulator programmable to control a temperature-increasing rate and a temperature-decreasing rate; not shown) to a predetermined growth temperature (in the present embodiment, 1800° C.) at a rate of 20° C./minute. When the predetermined growth temperature was reached, the temperature was maintained for 10 minutes. After the 10 minutes, the internal temperature of the container was lowered to 500° C. at the rate of 20° C./minute. The container was let stand to be cooled from 500° C. to room temperature. This formed on the monocrystal SiC substrate 11 a buffer layer 12 made of a SiC epitaxial film (4H—SiC) having a carrier density in a range from $9 \times 10^{17}$ to $2 \times 10 \times 10^{18}$ cm$^{-2}$ (n-type), and having a film thickness in a range from 8 μm to 10 μm. Note that although the growth temperature was maintained for 10 minutes in the present embodiment, the period is not limited to this. The period may be set as appropriate in accordance with a thickness of a desired SiC epitaxial film.

The predetermined growth temperature is not particularly limited, provided that it is not lower than 1420° C., which is the melting point of Si. However, to grow a SiC epitaxial film efficiently and stably, the growth temperature preferably falls within a range from 1500° C. to 2300° C.

The following describes how the active layer 13 is formed on the buffer layer 12. In the present embodiment, a monocrystal SiC epitaxial film was formed on the buffer layer 12 by step-controlled epitaxy (vapor phase growth method) to obtain the active layer 13, under the following conditions. Carrier gas: $H_2$ (hydrogen) 50 SLM; carbon material: $C_3H_8$ (propane); silicon material: $SiH_4$ (silane); n-type dopant: $N_2$ (nitrogen); carbon/silicon ratio (C/Si): 1.1; growth temperature: 1650° C.; pressure: $6.7 \times 10^3$ Pa. This provided an active layer 13 having a carrier density in a range from $4 \times 10^{15}$ to $6 \times 10^{15}$ cm$^{-2}$, and having a thickness of approximately 10 μm.

The following describes a result of an experiment conducted to verify an effect, achieved by the provision of the buffer layer 12, of preventing defects in the active layer 13.

The experiment was conducted as follows: The experiment used the following placed in a closed container one on top of another in the order presented below: the supporting substrate 22, the monocrystal SiC substrate 11, the spacers 23, the carbon source plate 24, the Si substrate 25, and the weight 26. A temperature inside the closed container was changed with a thermoregulator programmable to control a temperature-increasing rate and a temperature-decreasing rate. Buffer layers 12 were grown under various temperature conditions. Each of the buffer layers was studied for its property of propagating micropipe defects, screw dislocations, and basal plane dislocations in the monocrystal SiC substrate 11, to its surface located opposite from the monocrystal SiC substrate 11. Table 1 shows respective growth conditions and growth results of the buffer layers 12.

TABLE 1

| Temperature-increasing rate (° C./min) | | 10 | 20 | 20 | 25 | 25 | 50 |
|---|---|---|---|---|---|---|---|
| Growth temperature (° C.) | | | | | 1800 | | |
| Growth period (min) | | | | | 10 | | |
| Temperature-decreasing rate (° C./min) | | 10 | 20 | 25 | 20 | 25 | 50 |
| Thickness of grown film (μm) | | | | | 8–10 | | |
| Blocking ratio (%) | Micropipe | 97.3 | 95.2 | 84.6 | 80.2 | 44.4 | 25 |
| | Screw dislocation | 99.5 | 98.1 | 96.4 | 93.5 | 83.6 | 70.5 |
| | Basal plane dislocation | 55.5 | 51.9 | 49.7 | 47.3 | 46.8 | 20.6 |

For each of the buffer layers, the growth temperature was set to 1800° C., while the growth period (during which the growth temperature was maintained) was set to 10 minutes. The "Temperature-increasing rate" in Table 1 refers to a rate of change in the temperature inside the closed container, the change regarding a range from when the temperature exceeded 1420° C., which is the melting point of Si, to when the temperature reached the growth temperature of 1800° C. The "Temperature-decreasing rate" refers to a rate of change in the temperature inside the closed container, the change regarding a range from the growth temperature of 1800° C. to 500° C.

Figure 4:
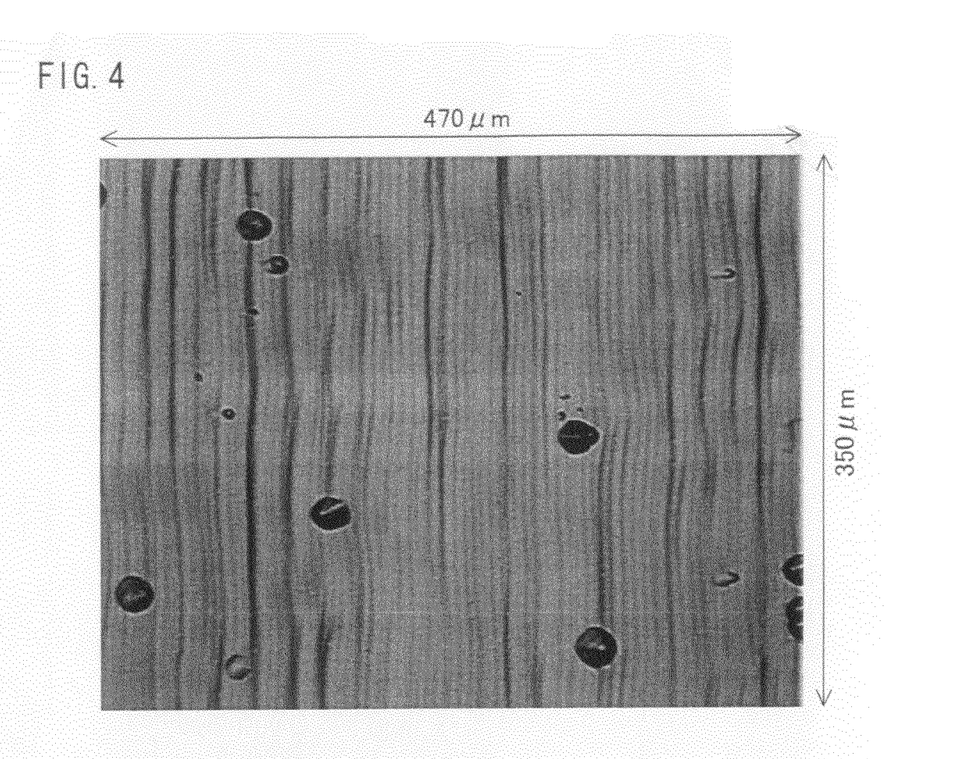
FIG. 4 is a picture showing a surface of a grown film after KOH melt etching.

Evaluations were made by comparing (i) a number of etch pits created by KOH melt etching of a surface (of the buffer layer 12, the surface being located opposite from the monocrystal SiC substrate 11) of each grown film with (ii) a number of etch pits created by KOH melt etching of the surface of the monocrystal SiC substrate 11 after the grown film had been completely removed by, e.g., a polish. More specifically, the evaluations were made on the basis of blocking ratios BR determined by the equation BR=1−E12/E11, where E12 is a number of etch pits caused by the defects (micropipes, screw dislocations, basal plane dislocations) in the surface of the buffer layer 12, and E11 is a number of etch pits caused by such defects in the surface of the monocrystal SiC substrate 11. Thus, a larger blocking ratio BR indicates a larger reduction in propagation of the defects. FIG. 4 is a picture of the surface of a grown film (buffer layer 12) after the KOH melt etching.

As shown in Table 1, setting the temperature-increasing rate and the temperature-decreasing rate to not higher than 20° C./minute allowed for reducing propagation of micropipe defects and screw dislocations in the monocrystal SiC substrate 11 to the surface of the buffer layer 12 by 95% or more, and also reducing propagation of basal plane dislocations in the monocrystal SiC substrate 11 to the surface of the buffer layer 12 by 50% or more. This shows that forming an active layer on the buffer layer 12 that is formed on the monocrystal SiC substrate 11 under the conditions of the temperature-increasing rate and the temperature-decreasing rate being not higher than 20° C./minute allows for reducing the propagation of micropipe defects and screw dislocations to the active layer 11 by 95% or more, and reducing the propagation of basal plane dislocations to the active layer 11 by 50% or more, in comparison with a case of forming an active layer directly on the surface of the monocrystal SiC substrate 11.

The buffer layer 12 formed by MSE reduces the propagation of defects inherent in the monocrystal SiC substrate 11, probably for the following reason.

MSE growth shows a large lateral growth driving force. This is particularly significant for step-flow growth. It is deduced that this reduces the propagation of the defects for the following reason. This highly large lateral growth driving force due to the step-flow growth is applied to the micropipes and the screw dislocations which are propagated along a direction (c-axis direction) substantially perpendicular to the substrate surface of the monocrystal SiC substrate 11. This results in decomposition of the micropipe defects into screw dislocations and thereby removes all the screw dislocations together with other crystal defects (e.g., basal plane dislocations) away from the substrate. This probably reduces the propagation of the defects. This analysis is supported by the fact that when the surface of the grown film is examined for etch pits created by KOH melt etching, almost no etch pits arising from screw dislocations are observed.

A basal plane dislocation propagated substantially along a plane (along a basal-plane direction) parallel to the substrate surface of the monocrystal SiC substrate 11 has a large longitudinal growth driving force. Further, MSE causes a film to be grown rapidly. These are probably the reasons that the lateral propagation of basal plane dislocations is prevented and that such basal plane dislocations are converted into longitudinal dislocations (e.g., edge dislocations). This analysis is supported, e.g., by the fact that while observation of etch pits created by KOH melt etching in the surface of the grown film provides a reduced number of defects propagated along an a-axis direction, the observation shows that a density of edge dislocations propagated along the c-axis direction is little changed.

As described above, the monocrystal SiC epitaxial substrate 1 of the present embodiment includes the monocrystal SiC substrate 11; the buffer layer 12 formed on the monocrystal SiC substrate 11; and the active layer 13 formed on the buffer layer 12. The buffer layer 12 is a SiC film epitaxially grown on the monocrystal SiC substrate 11 by heat-treating a set of the monocrystal SiC substrate 11, the carbon source plate 24, and the metal Si melt layer 27, the carbon source plate 24 being so disposed away from the monocrystal SiC substrate 11 by a predetermined distance as to face it, the metal Si melt layer 27 being interposed between the monocrystal SiC substrate 11 and the carbon source plate 24. The active layer 13 is a film epitaxially grown on the buffer layer 12 by vapor phase growth method.

The buffer layer 12 made of a SiC epitaxial film grown by the above method has a property of not easily propagating crystal defects such as basal plane dislocations and screw dislocations, in comparison with SiC epitaxial films grown by conventional vapor phase or liquid phase growth method. This prevents crystal defects such as basal plane dislocations and screw dislocations from being propagated to the active layer 13 formed on the buffer layer 12. This provides an active layer 13 being very low in defects.

Further, even use of an inexpensive monocrystal SiC substrate 11 having relatively many defects allows for formation of an active layer 13 made of a monocrystal SiC epitaxial film being very low in defects. In addition, controlling the distance between the monocrystal SiC substrate 11 and the carbon source plate 24 allows for easy and accurate control of the thickness of the metal Si melt layer 27. This in turn allows the film thickness of the buffer layer 12 to be so controlled accurately as to achieve its uniformity.

Also, in general, vapor phase growth method allows for easy and accurate control of properties such as film thickness, in comparison with other methods such as liquid phase growth method. As a result, the above arrangement allows for provision of a monocrystal SiC epitaxial substrate 1 including an active layer 13 having a film thickness controlled accurately and uniformly.

The monocrystal SiC substrate 11 of the present embodiment has an off angle. This allows for growing a monocrystal SiC epitaxial film by step-controlled epitaxy when the active layer 13 is formed, and also allows the film thickness of the active layer 13 to be so controlled further accurately as to achieve its uniformity. Note that while the present embodiment used a substrate having an 8-degree off angle, the off angle is not limited to this. The substrate is simply required at least to have any off angle. Thus, a substrate having an off angle of, e.g., 2 degrees or 4 degrees may also be used instead. Even in this case, an effect substantially equivalent to the above is achievable.

The monocrystal SiC substrate 11 of the present embodiment had a surface (on which the buffer layer 12 is grown) having been planarized before the buffer layer 12 was formed. The use of a monocrystal SiC substrate 11 having an off angle allows for step-flow growth of a monocrystal SiC epitaxial film for forming the buffer layer 12, the growth occurring along the off-angle direction. Thus, polishing marks in the surface of the monocrystal SiC substrate 11 or adherent matters such as residues remaining on the surface after cleaning causes new defects to occur originating from such polishing marks or adherent matters. In contrast, the monocrystal SiC substrate 11 of the present embodiment had a planarized surface on which the buffer layer is grown. This completely eliminates polishing marks in and adherent matters on the substrate surface, thus preventing crystal defects from occurring in the buffer layer 12. Note that while the planarizing process of the present embodiment was performed by CMP, the planarizing process is not limited to this. Thus, the planarizing process may, for example, be performed by repeating the follow steps: A $SiO_2$ film is formed on the substrate surface by thermal oxidation. The $SiO_2$ film is then removed with, e.g., hydrofluoric acid. Note further that the present invention is not limited by the use of a monocrystal SiC substrate 11 having been subjected to the planarizing process. A monocrystal SiC substrate 11 having been subjected to no planarizing process may also be used instead.

The present embodiment includes spacers 23 for defining the distance between the monocrystal SiC substrate and the carbon source plate 24. The spacers 24 are provided at the ends located along the off-angle direction of the monocrystal SiC substrate 11. In other words, the two spacers 23 are provided at ends of a region faced by the monocrystal SiC substrate 11 and the carbon source plate 24 so that a direction connecting the two spacers 23 is parallel to the off angle direction.

The use of the monocrystal SiC substrate 11 having an off angle results in step-flow growth of a monocrystal SiC epitaxial film for forming the buffer layer 12, the growth occurring along the off angle direction. Thus, providing spacers 23 at positions other than the ends along the off angle direction (or providing spacers 23 at random positions) unfortunately leads to crystal defects due to such spacers 23 (i.e., crystal defects originating from the spacers 23) occurring in a wide region at a central portion of the substrate. This is because, for example, crystal defects tend to propagate along a direction perpendicular to the direction of step-flow growth. In contrast, providing spacers 23 at the ends along the off-angle direction limits occurrence of crystal defects due to the spacers 23 to upstream and downstream ends along the direction of step-flow growth. This prevents crystal defects due to the spacers 23 from occurring in the central portion of the substrate.

For the heat treatment for forming the buffer layer 12, the present embodiment sets the rate of change in the temperature inside the closed container to 20° C./minute during (i) the temperature-increasing step for raising the temperature from room temperature to the growth temperature and (ii) the temperature-decreasing step for lowering the temperature from the growth temperature to 500° C.

The above growth temperature, which is a high temperature of not lower than 1420° C., places thermal stress on a growing film during the temperature-increasing step and the temperature-decreasing step. A sharp rise or drop in the temperature leads to overly high thermal stress, thus distorting the crystal structure. This in turn causes cracks and/or crystal defects.

In view of this, the present embodiment sets the rate of change in the temperature to 20° C./minute during the temperature-increasing step and the temperature-decreasing step. This reduces thermal stress placed on the buffer layer 12, thus preventing such defects as cracks from occurring due to the thermal stress.

In the temperature-increasing step, a defect such as a crack occasionally occurred in constituent members within a range from room temperature to 1420° C. for any rate higher than approximately 20° C./minute, while no defect such as a crack occurred within a range from 1420° C. to the growth temperature of 1800° C. for the rate of 20° C./minute. In the temperature-decreasing step, a defect such as a crack occasionally occurred in constituent members within a range from the growth temperature of 1800° C. to 1420° C. for any rate higher than 20° C./minute, while no defect such as a crack occurred within a range from 1420° C. to 500° C. for the rate of 20° C./minute. Thus, setting the growth rate for the range from room temperature to the growth temperature and also the temperature-decreasing rate for the range from the growth temperature to 500° C. to not higher than 20° C./minute prevents breakage such as a crack from occurring due to thermal stress.

To prevent, e.g., cracks due to thermal stress and crystal defects caused by distortion in the crystal structure, the temperature of the metal Si melt layer 27 is preferably changed at a rate that is not higher than 20° C./minute and as low as possible. In other words, 0° C./minute<Tv≤20° C./minute is preferably satisfied, and 0° C./minute<Tv≤15° C./minute is more preferably satisfied, where Tv is the rate of change in the temperature (temperature of the metal Si melt layer 27) within the closed container. However, setting the rate of change too low leads to low productivity. In view of this, to prevent e.g., cracks due to thermal stress and crystal defects caused by distortion in the crystal structure and also to reduce decrease in the productivity to a minimum, the temperature (temperature of the metal Si melt layer 27) inside the closed container is changed at such a rate Tv as to preferably satisfy 0.5° C./minute≤Tv≤20° C./minute or as to more preferably satisfy 0.5° C./minute≤Tv≤15° C./minute.

According to the example illustrated in FIG. 2, the closed container contains the supporting substrate 22, the monocrystal SiC substrate 11, the spacers 23, the carbon source plate 24, the Si substrate 25, and the weight 26, placed one on top of another in this order. However, the arrangement of these members is not limited to this. They may be arranged in any manner, provided that a metal Si melt layer is interposed between the monocrystal SiC substrate 11 and the carbon source plate 24 during the heat treatment.

Figure 5:
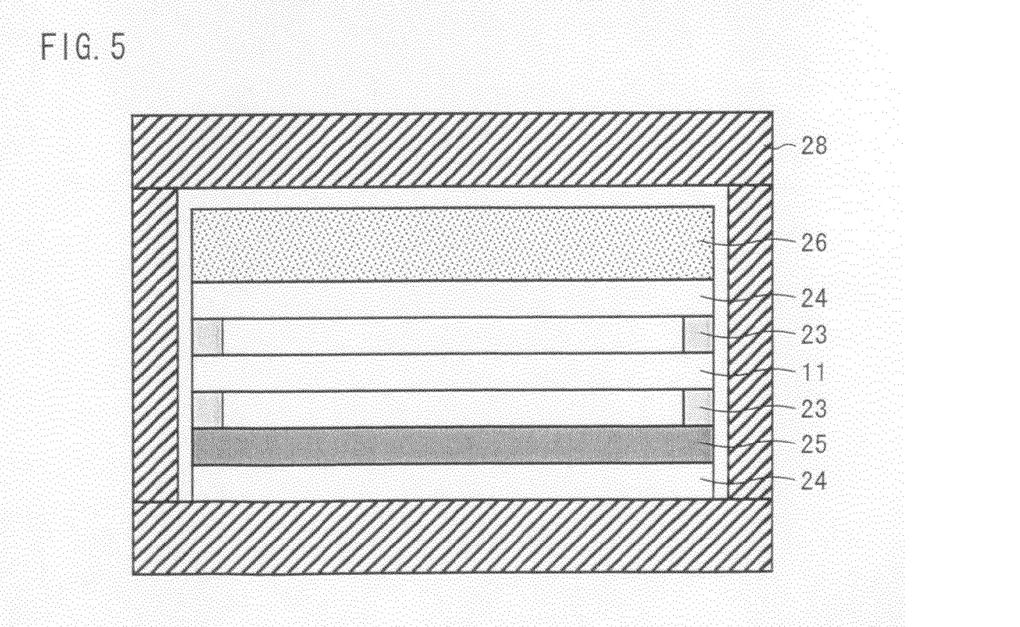
FIG. 5 is an explanatory diagram illustrating a modification of the method for producing the monocrystal SiC epitaxial substrate in accordance with the embodiment of the present invention. This modification is to modify as to how each member is arranged when the buffer layer is formed.

For example, as illustrated in FIG. 5, a closed container 28 may contain a carbon source plate 24, a Si substrate 25, spacers 23, a monocrystal SiC substrate 11, other spacers 23, another carbon source plate 24, and a weight 26, placed one on top of another in this order.

In the arrangement illustrated in FIG. 5, either or both of (i) the spacers 23 provided below the monocrystal SiC substrate 11 and (ii) the spacers 23 provided above the monocrystal SiC substrate 11 may be omitted. Further, the example illustrated in FIG. 5 includes two carbon source plates 24: one above and the other below the monocrystal SiC substrate 11. However, the arrangement is not limited to this. Only one carbon source plate 24 may be provided on one side.

The closed container containing the above members arranged as illustrated in FIG. 5 was caused to have an internal pressure reduced to not more than $1 \times 10^{-2}$ Pa (i.e., evacuation was performed). Then, while the pressure was maintained, an internal temperature of the container was raised with a heater (thermoregulator programmable to control a temperature-increasing rate and a temperature-decreasing rate; not shown) to a predetermined growth temperature (in the present embodiment, 1800° C.) at a rate of 20° C./minute. When the predetermined growth temperature was reached, the temperature was maintained for 10 minutes. After the 10 minutes, the internal temperature of the container was lowered to 500° C. at the rate of 20° C./minute. The container was let stand to be cooled spontaneously from 500° C. to room temperature. This formed on the monocrystal SiC substrate 11 a buffer layer 12 made of a SiC epitaxial film (4H—SiC) having a carrier density in a range from $9 \times 10^{17}$ to $2 \times 10^{18}$ cm$^{-2}$ (n-type), and having a film thickness in a range from 8 μm to 10 μm.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to a monocrystal SiC epitaxial substrate including on a monocrystal SiC substrate an active layer made of a SiC epitaxial film. The monocrystal SiC epitaxial substrate of the present invention includes an active layer being low in crystal defects and the like, and is thus suitably applicable to light-emitting diodes, various semiconductor diodes, and electronic devices.

The invention claimed is:

1. A method for producing a monocrystal SiC epitaxial substrate,
   the monocrystal SiC epitaxial substrate including:
   a monocrystal SiC substrate;
   a buffer layer made of a first SiC epitaxial film formed on the monocrystal SiC substrate; and
   an active layer made of a second SiC epitaxial film formed on the buffer layer,
   the method comprising:
   a first film forming step for forming the first SiC epitaxial film by heat-treating a set of (i) the monocrystal SiC substrate, (ii) a carbon source plate, and (iii) a metal Si melt layer having a predetermined thickness and interposed between the monocrystal SiC substrate and the carbon source plate, so as to epitaxially grow monocrystal SiC; and
   a second film forming step for forming the second SiC epitaxial film by epitaxially growing monocrystal SiC on the first epitaxial film by vapor phase growth method,
   wherein:
   the first film forming step includes:
   a temperature-increasing step for increasing a temperature of the metal Si melt layer to a predetermined growth temperature set to a temperature not lower than a melting point of Si; and
   a temperature-decreasing step for decreasing the temperature of the metal Si melt layer from the predetermined growth temperature to a temperature not higher than 500° C.;
   the temperature of the metal Si melt layer is changed at least from the melting point of Si to the growth temperature at a rate of 20° C. or less per minute during the temperature-increasing step; and
   the temperature of the metal Si melt layer is changed at the rate of 20° C. or less per minute during the temperature-decreasing step.

2. The method for producing a monocrystal SiC epitaxial substrate according to claim 1, wherein, in the first film forming step, the monocrystal SiC substrate has a planarized surface, and the first SiC epitaxial film is grown on the planarized surface of the monocrystal SiC substrate.

3. The method for producing a monocrystal SiC epitaxial substrate according to claim 1,
   wherein:
   the monocrystal SiC substrate has an off angle; and
   the method includes providing spacers at ends of a region between the monocrystal SiC substrate and the carbon source plate, the ends being located along a direction of inclination of the off angle, as to maintain a distance between the monocrystal SiC substrate and the carbon source plate during the first film forming step.

4. A method for producing a monocrystal SiC epitaxial substrate,
   the monocrystal SiC epitaxial substrate including:
   a monocrystal SiC substrate; and a SiC epitaxial film formed on the monocrystal SiC substrate, the method comprising:

a film forming step for forming the SiC epitaxial film by heat-treating a set of (i) the monocrystal SiC substrate, (ii) a carbon source plate, and (iii) a metal Si melt layer having a predetermined thickness and interposed between the monocrystal SiC substrate and the carbon source plate, so as to epitaxially grow monocrystal SiC, wherein:

the film forming step includes:

a temperature-increasing step for increasing a temperature of the metal Si melt layer to a predetermined growth temperature set to a temperature not lower than a melting point of Si; and a temperature-decreasing step for decreasing the temperature of the metal Si melt layer from the predetermined growth temperature to a temperature not higher than 500° C., the temperature of the metal Si melt layer is changed from the melting point of Si to the growth temperature at a rate of 20° C. or less per minute during the temperature-increasing step; and the temperature of the metal Si melt layer is changed at the rate of 20° C. or less per minute during the temperature-decreasing step.

5. The method for producing a monocrystal SiC epitaxial substrate according to claim 4, the monocrystal SiC substrate having an off angle, the method further comprising:

providing spacers at ends of a region between the monocrystal SiC substrate and the carbon source plate, the ends being located along a direction of inclination of the off angle, as to maintain a distance between monocrystal SiC substrate and the carbon source plate during the step of forming the SiC epitaxial film.

* * * * *